US012757648B2

(12) United States Patent
Ueno et al.

(10) Patent No.: US 12,757,648 B2
(45) Date of Patent: Oct. 6, 2026

(54) SUBSTRATE PROCESSING METHOD AND SUBSTRATE PROCESSING APPARATUS

(71) Applicant: Tokyo Electron Limited, Tokyo (JP)

(72) Inventors: Tetsuji Ueno, Yamanashi (JP); Tomoya Hasegawa, Yamanashi (JP); Shuntaro Takahashi, Yamanashi (JP); Takuya Fukumoto, Yamanashi (JP); Junya Shinohara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 19/073,481

(22) Filed: Mar. 7, 2025

(65) Prior Publication Data

US 2025/0293024 A1 Sep. 18, 2025

(30) Foreign Application Priority Data

Mar. 12, 2024 (JP) ................................ 2024-037837

(51) Int. Cl.

| | |
|---|---|
| ***H01L 21/02*** | (2006.01) |
| ***C23C 16/52*** | (2006.01) |
| ***H10P 14/20*** | (2026.01) |
| ***H10P 14/24*** | (2026.01) |
| ***H10P 95/90*** | (2026.01) |

(52) U.S. Cl.
CPC .......... *H10P 14/3411* (2026.01); *C23C 16/52* (2013.01); *H10P 14/24* (2026.01); *H10P 14/3602* (2026.01); *H10P 95/90* (2026.01)

(58) Field of Classification Search
CPC .. H10P 14/3411; H10P 95/90; H10P 14/3602; C23C 16/52
See application file for complete search history.

(56) References Cited

U.S. PATENT DOCUMENTS

2022/0301854 A1* 9/2022 Horita .................... C23C 16/24

FOREIGN PATENT DOCUMENTS

JP H05-259091 10/1993

* cited by examiner

*Primary Examiner* — Nathan T Leong
(74) *Attorney, Agent, or Firm* — IPUSA, PLLC

(57) ABSTRACT

A substrate processing method includes: preparing a substrate in which a silicon oxide film is formed on a surface of a silicon substrate; supplying a fluorine containing gas and a basic gas to the substrate having the silicon oxide film to remove the silicon oxide film; supplying a hydrogen gas to the substrate in which the silicon oxide film is removed and applying a thermal treatment to the substrate; supplying a mixed gas of a germanium containing gas diluted with a hydrogen gas to the substrate to which the thermal treatment is applied to perform pre-cleaning of the substrate; and forming a silicon germanium film by epitaxial growth on the substrate to which the pre-cleaning is performed.

7 Claims, 5 Drawing Sheets

SUBSTRATE PROCESSING METHOD AND SUBSTRATE PROCESSING APPARATUS

CROSS-REFERENCE TO RELATED APPLICATIONS

This application is based upon and claims priority to Japanese Patent Application No. 2024-037837, filed on Mar. 12, 2024, the entire contents of which are incorporated herein by reference.

BACKGROUND

1. Field of the Invention

The present disclosure relates to a substrate processing method and a substrate processing apparatus.

2. Description of the Related Art

Japanese Patent Application Publication No. H5-259091 discloses a method of manufacturing a semiconductor device in which a silicon-germanium single crystal film is epitaxially grown by vapor phase growth of silicon-germanium.

SUMMARY

A substrate processing method according to an aspect of the present disclosure includes: preparing a substrate in which a silicon oxide film is formed on a surface of a silicon substrate; supplying a fluorine containing gas and a basic gas to the substrate having the silicon oxide film to remove the silicon oxide film; supplying a hydrogen gas to the substrate in which the silicon oxide film is removed and applying a thermal treatment to the substrate; supplying a mixed gas of a germanium containing gas diluted with a hydrogen gas to the substrate to which the thermal treatment is applied to perform pre-cleaning of the substrate; and forming a silicon germanium film by epitaxial growth on the substrate to which the pre-cleaning is performed.

DETAILED DESCRIPTION OF THE DISCLOSURE

Figure 1:
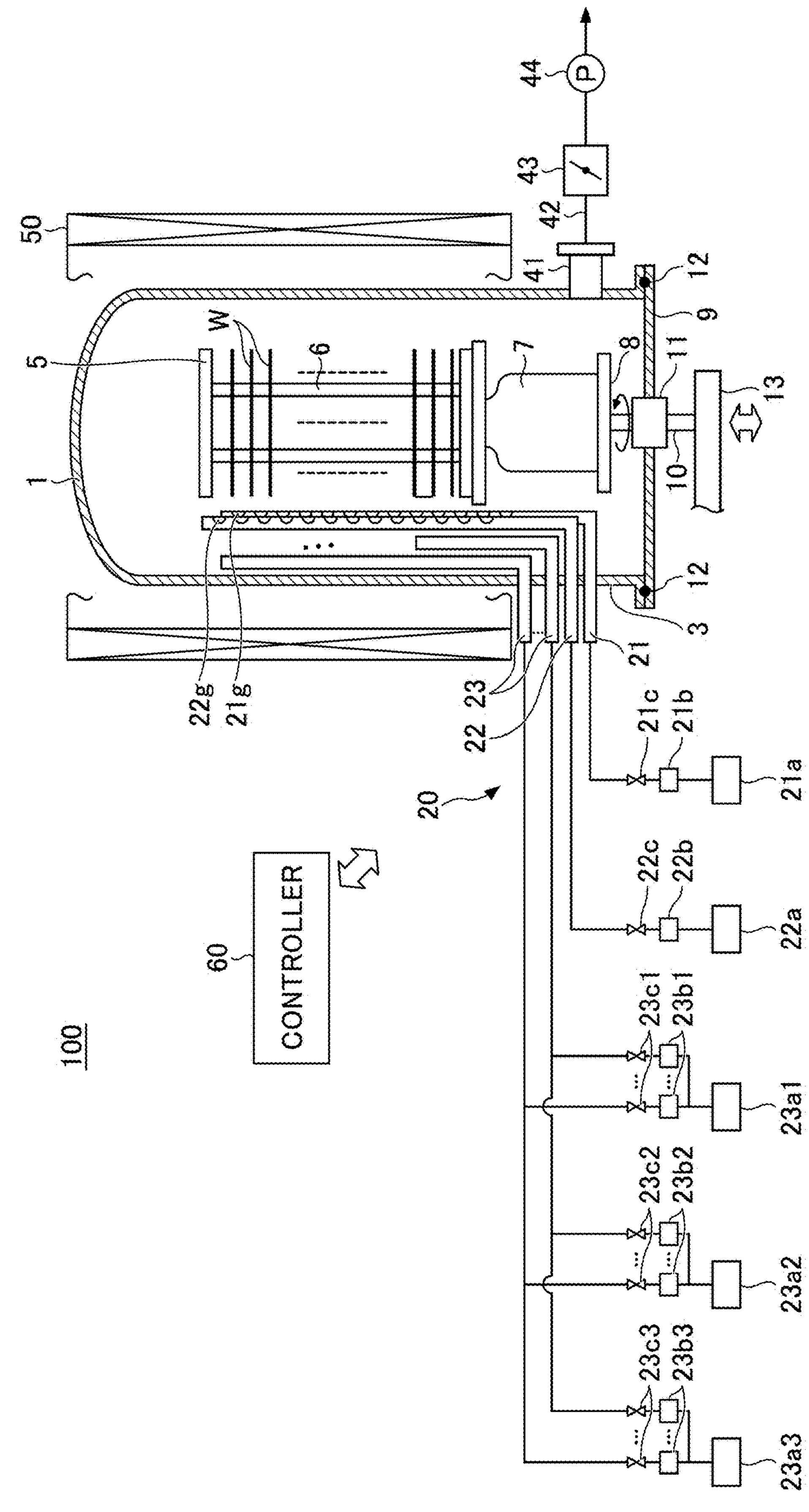
FIG. 1 is an example of a schematic diagram illustrating a configuration example of a substrate processing apparatus according to the embodiment.

Hereinafter, an embodiment of the present disclosure will be described with reference to the drawings. In each of the drawings, the same components are denoted by the same reference numerals, and duplicate descriptions may be omitted.

Substrate Processing Apparatus

A substrate processing apparatus 100 according to the present embodiment will be described with reference to FIG. 1. FIG. 1 is an example of a schematic diagram illustrating a configuration example of the substrate processing apparatus 100 according to the present embodiment.

The substrate processing apparatus 100 has a cylindrical process chamber 1 with a ceiling and an open lower end. The entire process chamber 1 is made of, for example, quartz.

From below the process chamber 1, a wafer boat (a substrate holding portion) 5 in which a large number (for example, 25 to 150) of semiconductor wafers (hereinafter referred to as "substrate W") are placed in multiple stages as substrates is inserted into the process chamber 1. In this manner, a large number of substrates W are accommodated in the process chamber 1 substantially horizontally at intervals along the vertical direction. The wafer boat 5 is made of, for example, quartz. The wafer boat 5 has three rods 6 (two are illustrated in FIG. 1), and a large number of substrates W are supported by grooves (not illustrated) formed in the rods 6.

The wafer boat 5 is mounted on a table 8 via a heat insulation cylinder 7 formed of quartz. The table 8 is supported on a rotating shaft 10 penetrating a metal (stainless steel) lid 9 that opens and closes an opening at the lower end of the process chamber 1.

A magnetic fluid seal 11 is provided at the penetrating portion of the rotating shaft 10 to hermetically seal the rotating shaft 10 and rotatably support the rotating shaft 10. A seal member 12 is provided between the periphery of the lid 9 and the lower end of the process chamber 1 to maintain airtightness in the process chamber 1.

The rotating shaft 10 is attached to the tip of an arm 13 supported by a lifting mechanism (not illustrated) such as a boat elevator, for example, and the wafer boat 5 and the lid 9 are lifted and lowered as one body, and inserted into and removed from the process chamber 1. The table 8 may be fixed to the lid 9 side to process the substrate W without rotating the wafer boat 5.

The substrate processing apparatus 100 includes a gas supply 20 for supplying predetermined gases such as a process gas and a purge gas into the process chamber 1.

The gas supply 20 includes gas supply pipes 21 to 23. The gas supply pipes 21 and 22 are formed of, for example, quartz, and penetrate inward the sidewall of a manifold 3 and extend vertically by bending upward. The upper ends of the vertical portions of the gas supply pipes 21 and 22 are closed. In the vertical portions of the gas supply pipes 21 and 22, a plurality of gas holes 21*g* and a plurality of gas holes 22*g* are formed at predetermined intervals over the vertical length corresponding to the wafer support area of the wafer boat 5. The gas holes 21*g* and 22*g* discharge gas in the horizontal direction. The gas supply pipe 23 includes a plurality of (n, where n is a natural number of 2 or more. In FIG. 1, only two are illustrated and the others are omitted.) gas supply pipes 23 of different heights, and is formed of, for example, quartz, and penetrates inward the sidewall of the process chamber 1 and extends vertically by bending upward. The upper end of the vertical portion of the gas supply pipe 23 is open and discharges supplied gases. In the vertical portions of the gas supply pipes 23 of different heights, a plurality of gas holes (not illustrated) may be formed at predetermined intervals on the sidewalls of the vertical portions of the gas supply pipes 23 in a portion having different heights.

The vertical portion of the gas supply pipe 21 (the vertical portion in which the gas holes 21*g* are formed) is provided in the process chamber 1. A fluorine containing gas (for example, HF gas) is supplied to the gas supply pipe 21 from a gas supply source 21*a* via gas piping. The gas piping is provided with a flow controller 21*b* and an on-off valve 21*c*. Thus, the fluorine containing gas from the gas supply source 21*a* is supplied to the process chamber 1 via the gas piping and the gas supply pipe 21.

The vertical portion of the gas supply pipe 22 (the vertical portion in which the gas holes 22*g* are formed) is provided in the process chamber 1. A basic gas (for example, $NH_3$ gas or amines such as $N(CH_3)_3$ and $N(C_2H_5)_3$) is supplied to the gas supply pipe 22 from the gas supply source 22*a* via the gas piping. The gas piping is provided with a flow controller 22*b* and an on-off valve 22*c*. Thus, the basic gas from the gas supply source 22*a* is supplied to the process chamber 1 via the gas piping and the gas supply pipe 22.

The vertical portion of the gas supply pipe 23 is provided in the process chamber 1. A gas supply source 23*a*1, a gas supply source 23*a*2, and a gas supply source 23*a*3 are connected to the gas supply pipe 23 via branched gas piping.

The gas supply source 23*a*1 supplies silicon (Si) containing gas to the gas supply pipe 23. The silicon containing gas may be $SiH_4$ (monosilane) gas, $SiH_2Cl_2$ (dichlorosilane), $SiH_3CH_3$ (monomethylsilane), or the like. The gas piping after the branch that connects to the gas supply source 23*a*1 is provided with a flow controller 23*b*1 and an on-off valve 23*c*1. The flow controller 23*b*1 and the on-off valve 23*c*1 are respectively provided corresponding to the plurality of gas supply pipes 23. Thus, the silicon containing gas from the gas supply source 23*a*1 is supplied into the process chamber 1 via the gas piping and the gas supply pipe 23.

The gas supply source 23*a*2 supplies a mixed gas of germanium containing gas ($GeH_4$ gas) diluted with hydrogen gas ($H_2$ gas) to the gas supply pipe 23. The germanium containing gas may be $GeH_4$ (germane) gas, $GeH_2$ (germylene) gas, $Ge_2H_6$ (digermane), or the like. The gas piping after the branch that connects to the gas supply source 23*a*2 is provided with a flow controller 23*b*2 and an on-off valve 23*c*2. The flow controller 23*b*2 and the on-off valve 23*c*2 are respectively provided corresponding to the plurality of gas supply pipes 23. Thus, the mixed gas of the germanium containing gas from the gas supply source 23*a*2 is supplied into the process chamber 1 via the gas piping and the gas supply pipe 23.

The gas supply source 23*a*3 supplies hydrogen ($H_2$) gas to the gas supply pipe 23. The gas piping after the branch that connects to the gas supply source 23*a*3 is provided with a flow controller 23*b*3 and an on-off valve 23*c*3. The flow controller 23*b*3 and the on-off valve 23*c*3 are respectively provided corresponding to the plurality of gas supply pipes 23. Thus, the hydrogen gas from the gas supply source 23*a*3 is supplied to the process chamber 1 via the gas piping and the gas supply pipe 23.

A purge gas is supplied to each of the gas supply pipes 21 to 23 from a purge gas supply source (not illustrated) via gas piping. The gas piping (not illustrated) is provided with a flow controller (not illustrated) and an on-off valve (not illustrated). Thus, the purge gas from the purge gas supply source is supplied to the process chamber 1 via the gas piping and the gas supply pipes 21 to 23. As the purge gas, for example, an inert gas such as nitrogen ($N_2$) gas and argon (Ar) gas may be used.

An exhaust port 41 for evacuating the inside of the process chamber 1 to a vacuum is provided on the sidewall of the process chamber 1 facing the position where the gas supply pipes 21 to 23 are disposed. The exhaust port 41 is formed on the lower sidewall of the process chamber 1. An exhaust pipe 42 for evacuating the process chamber 1 is connected to the exhaust port 41. An exhaust device 44 that includes a pressure control valve 43 for controlling the pressure in the process chamber 1, a vacuum pump, and the like is connected to the exhaust pipe 42, and the inside of the process chamber 1 is evacuated via the exhaust pipe 42 by the exhaust device 44.

A cylindrical heating mechanism 50 for heating the process chamber 1 and the substrate W inside the process chamber 1 is provided so as to surround the outer periphery of the process chamber 1.

The substrate processing apparatus 100 includes a controller 60. The controller 60 controls, for example, the operation of each part of the substrate processing apparatus 100, for example, the supply/stop of each gas by opening/closing the on-off valves 21*c* to 23*c*3, the control of the gas flow rate by the flow controllers 21*b* to 23*b*3, the pressure control by the pressure control valve 43, and the exhaust control by the exhaust device 44. The controller 60 controls the temperature of the substrate W by the heating mechanism 50.

The controller 60 may be, for example, a computer. The computer program for operating each part of the substrate processing apparatus 100 is stored in a storage medium. The storage medium may be, for example, a flexible disk, a compact disk, a hard disk, a flash memory, a DVD, or the like.

Substrate Processing Method

Figure 2:
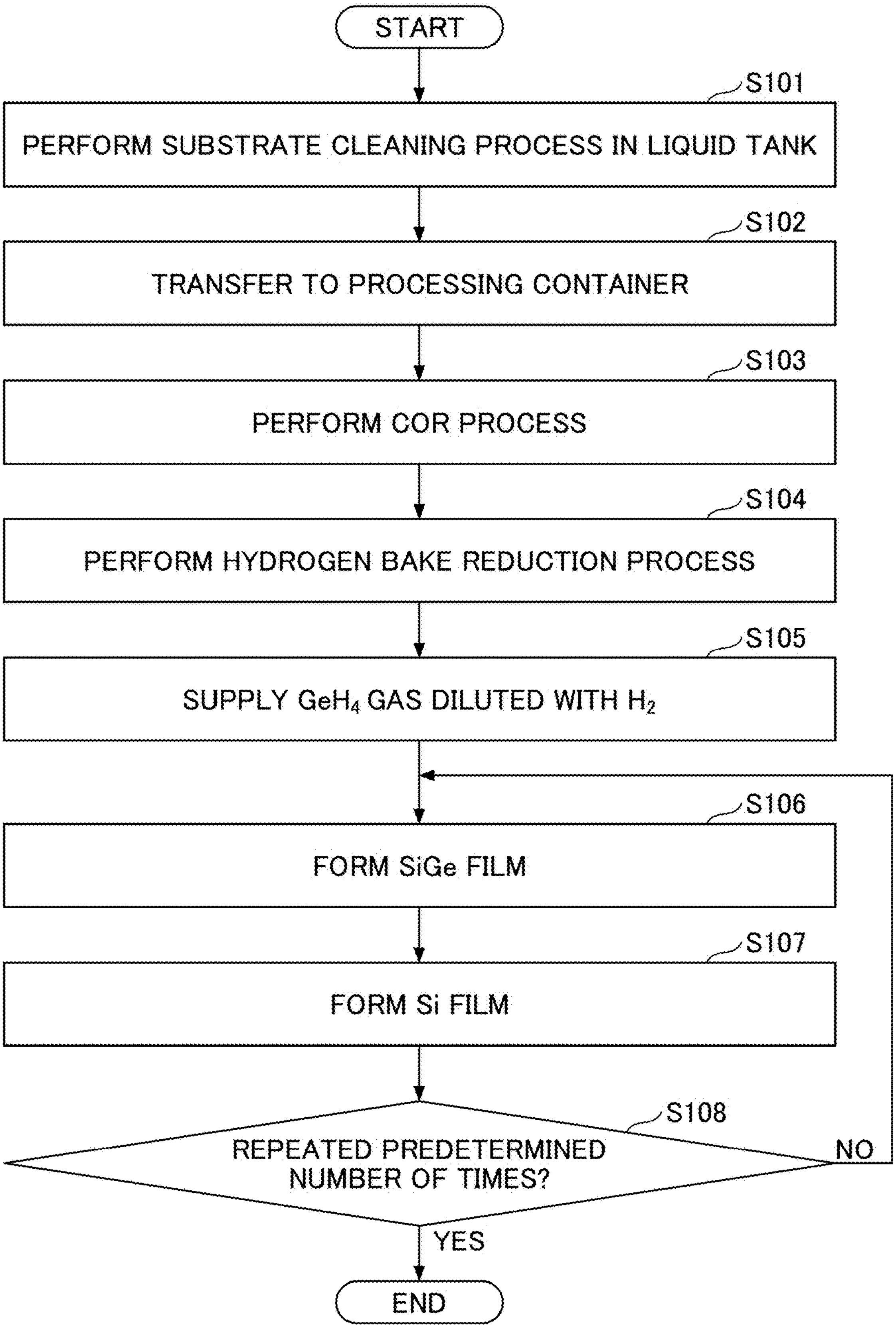
FIG. 2 is a flowchart illustrating an example of a substrate processing method according to the embodiment.
Figure 3:
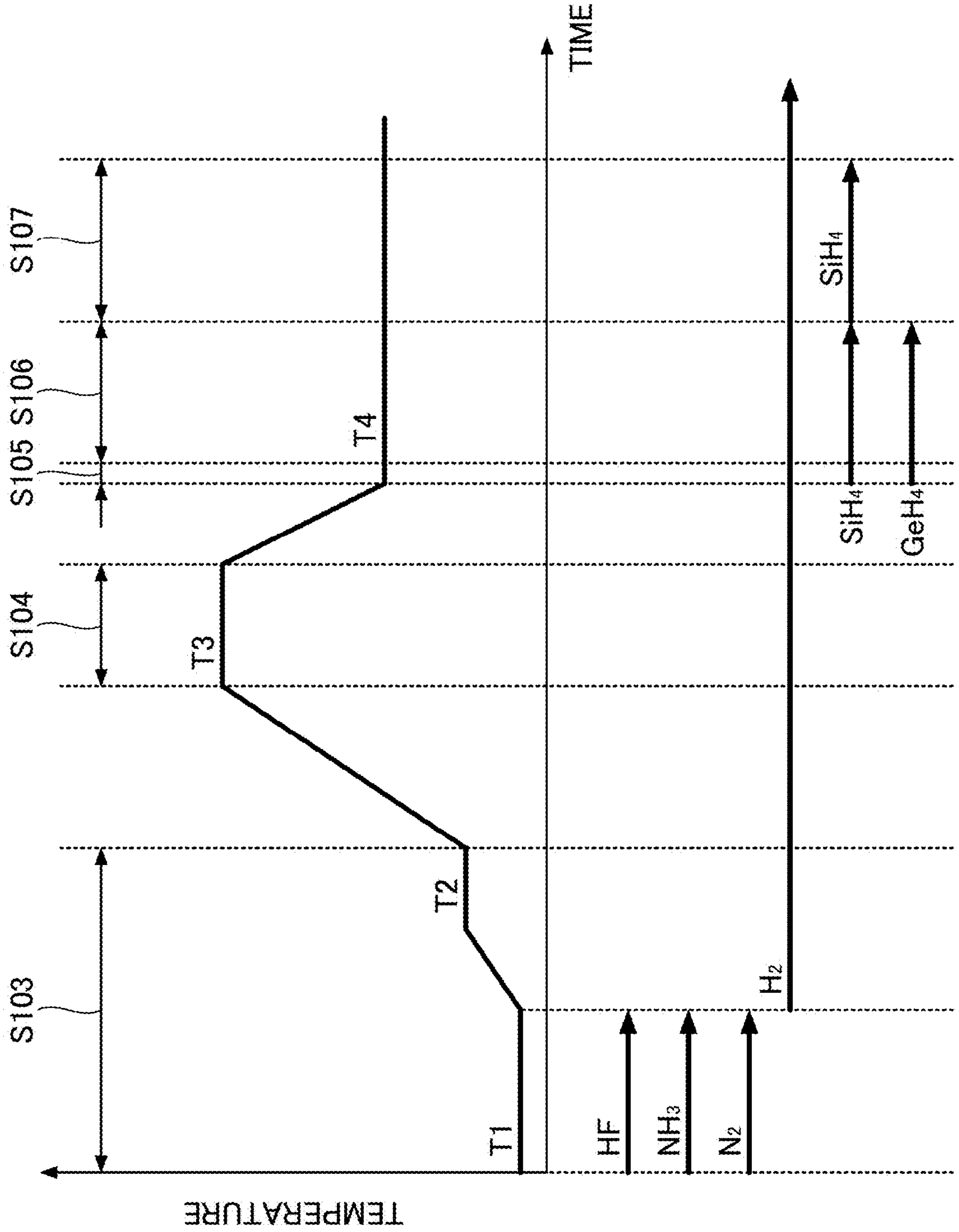
FIG. 3 is a sequence diagram illustrating an example of the substrate processing method according to the embodiment.

Next, an example of a substrate processing method by the substrate processing apparatus 100 will be described. FIG. 2 is a flowchart illustrating an example of a substrate processing method according to the present embodiment. FIG. 3 is a sequence diagram illustrating an example of a substrate processing method according to the present embodiment. In FIG. 3, the temperature of the substrate W is illustrated in the upper row, and the supply timings of various gases are indicated by arrows in the lower row. FIG. 4 is an example of a schematic cross-sectional diagram of the substrate W in each step. Here, a process of forming a silicon germanium film (SiGe film) 410 and a silicon film (Si film) 420 by epitaxial growth on the substrate W formed of single crystal silicon 400 will be described.

In step S101, a cleaning process is performed on the substrate W in a liquid tank. In the cleaning process in the liquid tank, the surface of the substrate W is cleaned by, for example, performing substrate cleaning (SPM cleaning) using a cleaning liquid in which sulfuric acid and hydrogen peroxide water are mixed at a predetermined proportion, substrate cleaning (DHF cleaning) using dilute hydrofluoric acid as a cleaning liquid, or substrate cleaning (APM cleaning) using a cleaning liquid in which ammonia water, hydrogen peroxide water, and pure water are mixed at a predetermined proportion. Thus, carbon impurities and water marks (drying marks) are removed from the substrate W.

Figure 4D:
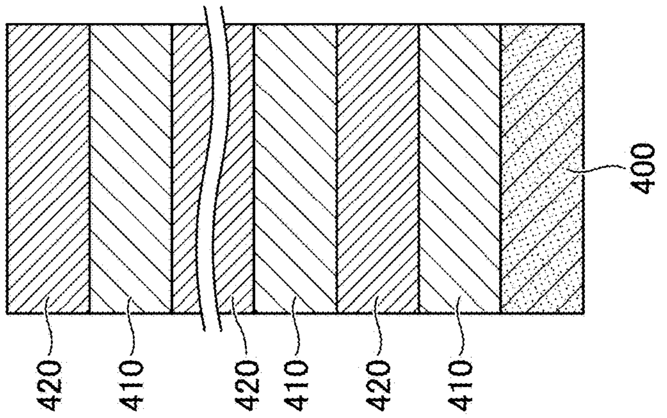
FIG. 4D is an example of the schematic cross-sectional diagram of the substrate W in each step.
Figure 4C:
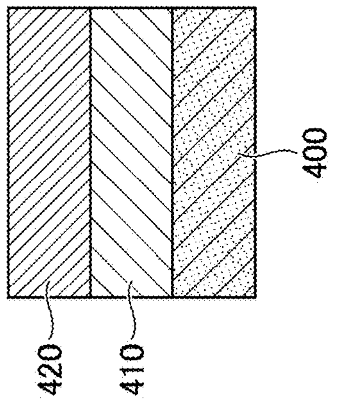
FIG. 4C is an example of the schematic cross-sectional diagram of the substrate W in each step.

In step S102, the cleaned substrate W is mounted on the wafer boat 5, and the wafer boat 5 on which the substrate W is mounted is transported into the process chamber 1. FIG. 4A is an example of a schematic cross-sectional diagram of the substrate W transported into the process chamber 1. As illustrated in FIG. 4A, a silicon oxide film 401 (for example, a native oxide film) is formed on the surface of the substrate W formed of the single crystal silicon 400.

In step S103, a chemical oxide removal (COR) process is performed on the substrate W to remove the silicon oxide film 401.

Here, as illustrated in FIG. 3, the controller 60 controls the heating mechanism 50 such that the temperature of the substrate W becomes a predetermined first temperature T1. Next, the controller 60 controls the flow controller 21*b* and the on-off valve 21*c* to supply the fluorine containing gas (HF gas) from the gas supply pipe 21 into the process chamber 1, and controls the flow controller 22*b* and the on-off valve 22*c* to supply the basic gas ($NH_3$ gas) from the gas supply pipe 22 into the process chamber 1. In addition, the inert gas ($N_2$ gas) is supplied into the process chamber 1 from the gas supply pipe 24. Thus, the fluorine containing gas and the basic gas are reacted with the silicon oxide film 401 on the surface of the substrate W to form ammonium silicofluoride ($(NH_4)_2SiF_6$) on the surface of the substrate W. Note that the first temperature T1 is a preferable temperature (for example, 65° C.) for reacting the fluorine containing gas, the basic gas, and the silicon oxide film 401 to form the ammonium silicofluoride. As the basic gas, amines such as $N(CH_3)_3$ and $N(C_2H_5)_3$ that form a silicofluoride compound in the same manner as $NH_3$, may be used.

Next, as illustrated in FIG. 3, the controller 60 stops the supply of the fluorine containing gas (HF gas), the basic gas ($NH_3$ gas), and the inert gas ($N_2$ gas) into the process chamber 1. Next, the controller 60 controls the heating mechanism 50 such that the temperature of the substrate W becomes a predetermined second temperature T2. The second temperature T2 is higher than the first temperature T1. The second temperature T2 is the temperature (for example, 200° C.) at which the ammonium silicofluoride is sublimated. The controller 60 controls the flow controller 23*b*3 and the on-off valve 23*c*3 to supply the $H_2$ gas from the gas supply pipe 23 into the process chamber 1. Thus, the ammonium silicofluoride formed on the surface of the substrate W is sublimated, and the gasified ammonium silicofluoride is discharged out of the process chamber 1.

Figure 4B:
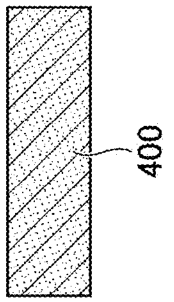
FIG. 4B is an example of the schematic cross-sectional diagram of the substrate W in each step.
Figure 4A:
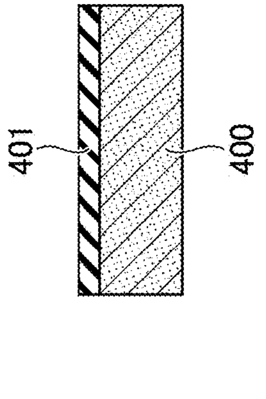
FIG. 4A is an example of a schematic cross-sectional diagram of a substrate W in each step.

FIG. 4B is an example of a schematic cross-sectional diagram of the substrate W after the process in step S103. As illustrated in FIG. 4B, the silicon oxide film 401 (see FIG. 4A) is removed from the surface of the substrate W formed of the single crystal silicon 400.

In step S104, a hydrogen bake reduction process (thermal treatment) is performed.

The controller 60 controls the heating mechanism 50 such that the temperature of the substrate W becomes a predetermined third temperature T3. The third temperature T3 is higher than the second temperature T2. The third temperature T3 is preferably 700° C. or more and 900° C. or less, for example. The third temperature T3 is more preferably 750° C. or more and 850° C. or less. The third temperature T3 is more preferably 750° C. or more and 800° C. or less. The controller 60 controls the flow controller 23*b*3 and the on-off valve 23*c*3 to supply the $H_2$ gas from the gas supply pipe 23 into the process chamber 1. Thus, the surface of the substrate W is reduced with the $H_2$ gas, and halogen (fluorine) from the process gas (the fluorine containing gas) used for the COR process is removed from the surface of the substrate W. Furthermore, by heating the substrate W to the third temperature T3 higher than the second temperature T2 of step S103, ammonium silicofluoride formed on the surface of the substrate W is further sublimated, and the silicon oxide film 401 is removed by the reaction with the remaining silicon oxide film 401. Note that even when the substrate W is heated to the third temperature T3, the residue of COR process remains on the surface of the substrate W, and it is difficult to completely remove it.

In step S105, the mixed gas of the germanium containing gas ($GeH_4$ gas) diluted with the hydrogen gas ($H_2$ gas) is supplied.

The controller 60 controls the heating mechanism 50 such that the temperature of the substrate W becomes a predetermined fourth temperature T4. The fourth temperature T4 is lower than the third temperature T3. The fourth temperature T4 is the temperature (for example, 450° C. or more and 600° C. or less) at which the SiGe film 410 and the Si film 420 described later are formed. The controller 60 also controls the flow controller 23*b*2 and the on-off valve 23*c*2 to supply the mixed gas of the germanium containing gas ($GeH_4$ gas) diluted with the hydrogen gas ($H_2$ gas) from the gas supply pipe 23 into the process chamber 1.

Here, the flow ratio of the $GeH_4$ gas in the mixed gas of the $GeH_4$ gas diluted with the $H_2$ gas is preferably greater than 0% (not including 0%) and 1% or less. More preferably, the flow ratio of the $GeH_4$ gas in the mixed gas of the $GeH_4$ gas diluted with the $H_2$ gas is preferably greater than 0.01% and 1% or less.

With respect to the $GeH_4$ gas in the mixed gas of the $GeH_4$ gas diluted with the $H_2$ gas, due to the chemical equilibrium relationship $$(GeH_4 \rightleftharpoons +GeH_2 + H_2),$$

$GeH_4$ can be more stable in the mixed gas having a higher ratio of $H_2$. In addition, by increasing the proportion of $GeH_4$ to $GeH_2$, when $GeH_4$ reacts with the surface of the single crystal silicon 400, $GeH_4$ undergoes a reduction reaction with impurities such as oxygen (O), nitrogen (N), and carbon (C) on the surface of the substrate W, promoting the removal of the impurities.

Thus, by supplying the mixed gas of the $GeH_4$ gas diluted with $H_2$ to the substrate W, the residue of the COR process is removed from the substrate W and impurities (oxygen (O), nitrogen (N), carbon (C), and the like) are removed from the surface of the single crystal silicon 400 of the substrate W. Thus, the surface of the substrate W is cleaned.

In step S105, the controller 60 may control the flow controller 23*b*2 and the on-off valve 23*c*2 to supply the silicon (Si) containing gas into the process chamber 1 from the gas supply pipe 23. That is, in step S105, the mixed gas of the germanium containing gas ($GeH_4$ gas) diluted with the hydrogen gas ($H_2$ gas) and the silicon (Si) containing gas may be simultaneously supplied. In this case, step S105 and step S106, which will be described later, may be regarded as a process for forming one SiGe film 410, and a pre-clean process with the $GeH_4$ gas diluted with $H_2$ illustrated in step S105 may be performed in the initial stage of the process for forming the SiGe film 410 on the single crystal silicon 400.

In step S105, the silicon (Si) containing gas may not be supplied into the process chamber 1. That is, the mixed gas of the germanium containing gas ($GeH_4$ gas) diluted with the hydrogen gas ($H_2$ gas) may be supplied in step S105, and the silicon (Si) containing gas may be supplied in step S106.

In step S105 and thereafter, the hydrogen gas ($H_2$ gas) from the gas supply source 23*a*3 may be continuously supplied or may not be supplied into the process chamber 1.

In step S106, the SiGe film 410 is formed on the substrate W.

Continuing from step S105, the controller 60 controls the heating mechanism 50 such that the temperature of the substrate W is the predetermined fourth temperature T4. Continuing from step S105, the controller 60 controls the flow controller 23*b*2 and the on-off valve 23*c*2 to supply the mixed gas of the germanium containing gas ($GeH_4$ gas) diluted with the hydrogen gas ($H_2$ gas) from the gas supply pipe 23 into the process chamber 1. The flow ratio of $GeH_4$ in the mixed gas may be the same as that of the mixed gas in step S105. The controller 60 controls the flow controller 23*b*1 and the on-off valve 23*c*1 to supply the silicon containing gas ($SiH_4$ gas) from the gas supply pipe 23 into the process chamber 1. In step S106, the hydrogen gas ($H_2$ gas) from the gas supply source 23*a*3 may be supplied into the process chamber 1, or the supply may be stopped.

Thus, the germanium containing gas ($GeH_4$ gas) and the silicon containing gas ($SiH_4$ gas) are supplied on the single crystal silicon 400 to form the SiGe film 410 by epitaxial growth.

Here, the surface of the substrate W is cleaned by the process of step S105, so that defects in the SiGe film 410 formed by the epitaxial growth can be reduced.

In addition, in the mixed gas of the $GeH_4$ gas diluted with $H_2$, the proportion of $GeH_4$ to $GeH_2$ becomes high. Thus, $GeH_2$, which becomes unstable when the germanium containing gas reacts on the surface of the single crystal silicon 400, can be reduced. As a result, the density of Ge clusters that are sources of defects in the SiGe film 410 decreases, and defects in the SiGe film 410 can be reduced.

In step S107, the Si film 420 is formed on the substrate W.

Continuing from steps S105 and S106, the controller 60 controls the heating mechanism 50 such that the temperature of the substrate W is the predetermined fourth temperature T4. Further, the controller 60 closes the on-off valve 23*c*2 and stops the supply of the mixed gas of the germanium containing gas ($GeH_4$ gas) diluted with the hydrogen gas ($H_2$ gas) into the process chamber 1. Further, continuing from step S106, the controller 60 controls the flow controller 23*b*1 and the on-off valve 23*c*1 to supply the silicon containing gas ($SiH_4$ gas) into the process chamber 1 from the gas supply pipe 23. In step S107, the hydrogen gas ($H_2$ gas) from the gas supply source 23*a*3 may be supplied into the process chamber 1, or the supply may be stopped.

Thus, the silicon containing gas ($SiH_4$ gas) is supplied onto the SiGe film 410 to form the Si film 420 by the epitaxial growth. FIG. 4C is an example of a schematic cross-sectional diagram of the substrate W after the process in step S107. As illustrated in FIG. 4C, the SiGe film 410 and the Si film 420 are stacked on the substrate W by the processes in steps S106 and S107.

In step S108, the controller 60 determines whether the stacking of the SiGe film 410 and the Si film 420 has been repeated a predetermined number of times. When the stacking has not been repeated the predetermined number of times (S108: NO), the controller 60 returns to step S106 and repeats the stacking of the SiGe film 410 and the Si film 420. When the stacking has been repeated the predetermined number of times (S108: YES), the substrate processing illustrated in FIG. 2 ends.

FIG. 4D is an example of a schematic cross-sectional diagram of the substrate W after the substrate process illustrated in FIG. 2. As illustrated in FIG. 4D, the SiGe film 410 and the Si film 420 are alternately stacked on the substrate W by repeating the processes of steps S106 and S107.

As described above, according to the substrate processing method illustrated in FIG. 2, defects in the SiGe film 410 formed by the epitaxial growth on the substrate W can be reduced.

Specifically, impurities and the like are cleaned from the surface of the substrate W by performing the substrate cleaning (SPM cleaning, DHF cleaning, or APM cleaning) with the liquid bath (step S101), the COR process (step S103), the hydrogen bake reduction process (step S104), and the pre-clean process with the mixed gas of the $GeH_4$ gas diluted with $H_2$ (step S105). As a result, by forming the SiGe film 410 by the epitaxial growth from the surface of the cleaned substrate W, defects in the SiGe film 410 can be reduced.

The pre-clean process of the substrate processing method according to the present embodiment will be described while comparing the substrate processing method according to a reference example with the substrate processing method according to the present embodiment.

In a substrate processing method according to a first reference example, impurities and the like are cleaned from the surface of the substrate W by performing the substrate cleaning (SPM cleaning, DHF cleaning, or APM cleaning) with the liquid tank (step S101), the COR process (step S103), and the hydrogen bake reduction process (step S104). In this case, the silicon oxide film 401 can be removed by the hydrogen bake reduction process (step S104) at 800° C. However, the residue of the COR process remains on the surface of the substrate W, which may cause defects when the SiGe film 410 is formed.

In a substrate processing method according to a second reference example, impurities and the like are cleaned from the surface of the substrate W by performing the substrate cleaning (SPM cleaning, DHF cleaning, or APM cleaning) with the liquid tank (step S101) and the hydrogen bake reduction process (step S104). In this case, the silicon oxide film 401 can be removed by the hydrogen bake reduction process (step S104) at 850° C. However, in the substrate processing method according to the second reference example, the bake temperature is higher than that of the substrate processing method according to the first reference example using the COR processing, and therefore, depending on the type of semiconductor device formed on the substrate W, it may not be applicable due to the temperature limitation.

In a substrate processing method according to a third reference example, impurities and the like are cleaned from the surface of the substrate W by performing the substrate cleaning (SPM cleaning, DHF cleaning, or APM cleaning) with the liquid tank (step S101) and the pre-clean process with the mixed gas of the $GeH_4$ gas diluted with $H_2$ (step S105). In this case, the silicon oxide film 401 and impurities and the like cannot be removed.

In contrast, in the substrate processing method according to the present embodiment, impurities and the like are cleaned from the surface of the substrate W by performing the substrate cleaning (SPM cleaning, DHF cleaning, or APM cleaning) with the liquid tank (step S101), the COR process (step S103), the hydrogen bake reduction process (step S104), and the pre-clean process with the mixed gas of the $GeH_4$ gas diluted with $H_2$ (step S105).

In the substrate processing method according to the present embodiment, the residue of the COR process can be removed. That is, the defects of the SiGe film 410 can be reduced compared with the first and third reference examples.

In the substrate processing method according to the present embodiment, the silicon oxide film 401 can be removed by the hydrogen bake reduction process (step S104) at 800° C. That is, compared with the second reference example, the bake temperature can be lowered and the application range of the process can be expanded.

A configuration of the substrate processing apparatus 100 in which the mixed gas of the germanium containing gas ($GeH_4$ gas) diluted with the hydrogen gas ($H_2$ gas) is supplied from the gas supply source 23*a*2 has been described as an example, but it is not limited to this. It may be a configuration in which the germanium containing gas ($GeH_4$ gas) is supplied from the gas supply source 23*a*2. In this configuration, the gas supply 20 may mix the germanium containing gas ($GeH_4$ gas) supplied from the gas supply source 23*a*2 and the hydrogen gas ($H_2$ gas) supplied from the gas supply source 23*a*3, and supply the mixed gas into the process chamber 1.

In the substrate processing method according to the present embodiment illustrated in FIG. 2, the processes of steps S102 to S108 have been described as being carried out in one process chamber 1, but it is not limited to this. It may be a configuration in which each process is carried out in a different process chamber. For example, the substrate processing apparatus may include a first process chamber for performing the COR process (step S103), a second process chamber for performing the hydrogen bake reduction process (step S104), a third process chamber for performing the pre-clean process with the mixed gas (step S105), the SiGe film formation process (step S106), and the Si film formation process (step S107), and a transport chamber connected to the first to third process chambers. The inside of the transport chamber is in a vacuum atmosphere or an inert gas atmosphere, and the substrate W can be transported from one process chamber to another without exposing the substrate W to the atmosphere. The vacuum transport chamber may include a transport device for transporting the substrate, and may be configured to transport the substrate from a wafer boat in one process chamber to a wafer boat in another process chamber. The vacuum transport chamber may include a transport device for transporting the wafer boat on which the substrate is mounted, and may be configured to transport the wafer boat from one process chamber to another process chamber.

The substrate processing apparatus 100 has been described as a batch-type substrate processing apparatus 100 for processing a plurality of substrates W held by the wafer boat 5, but is not limited thereto. The substrate processing method illustrated in FIG. 2 may be applied to a single-wafer type substrate processing apparatus.

In the above description, the SiGe film 410 is formed by supplying the mixed gas of the germanium (Ge) containing gas diluted with the hydrogen gas and the silicon (Si) containing gas, but it is not limited thereto. Carbon (C) may be added to the SiGe film 410 by supplying the mixed gas of the germanium (Ge) containing gas diluted with the hydrogen gas, the silicon (Si) containing gas, and a carbon (C) containing gas. Similarly, carbon (C) may be added to the Si film 420 by supplying the silicon (Si) containing gas and the carbon (C) containing gas.

Example of Measurement Result

Figure 5:
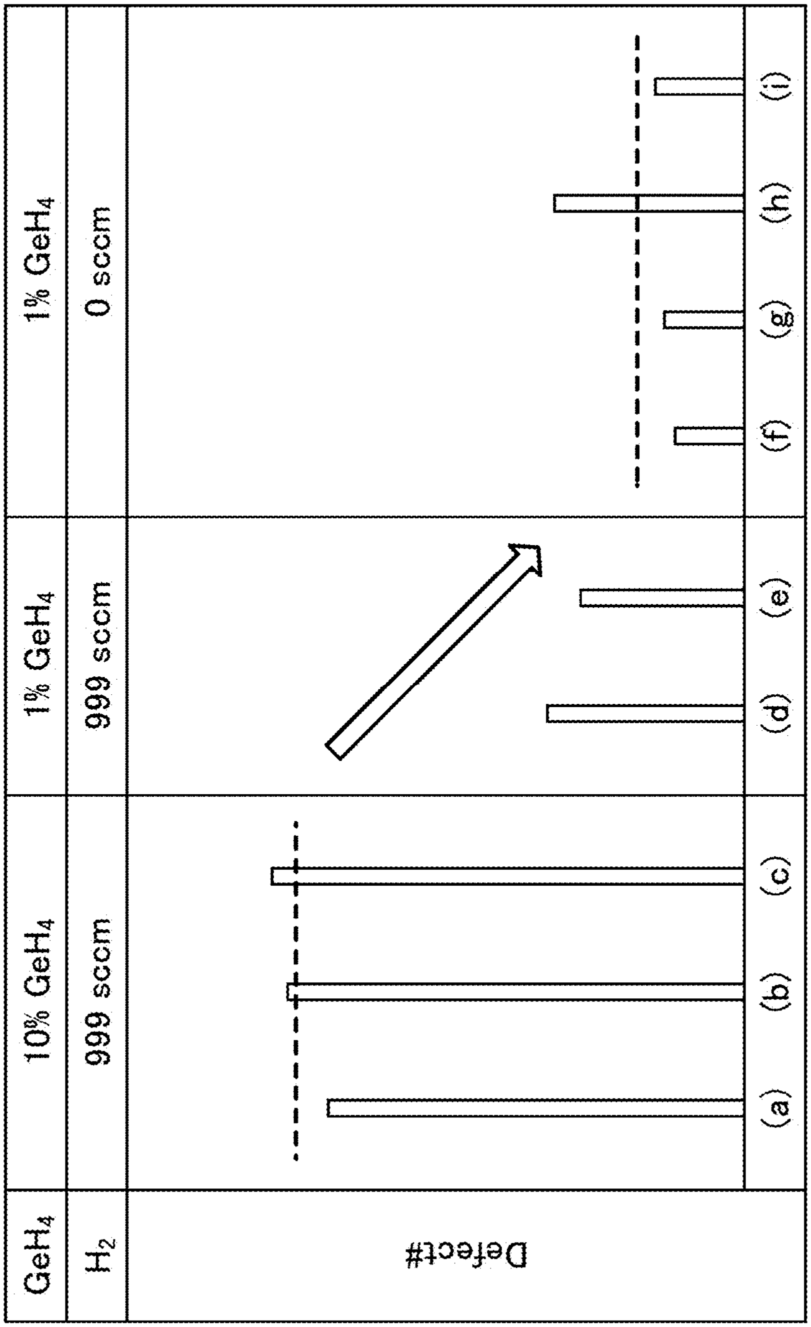
FIG. 5 is a graph illustrating an example of measurement results.

Next, an example of measurement results will be described with reference to FIG. 5. FIG. 5 is a graph illustrating an example of measurement results. First, the plurality of substrates W were subjected to the substrate cleaning (SPM cleaning, DHF cleaning, or APM cleaning) with the liquid tank (step S101). Next, the plurality of substrates W were placed on the wafer boat 5, and the COR process (step S103) and the hydrogen bake reduction process (step S104) were performed by the batch-type substrate processing apparatus 100. Next, the $SiH_4$ gas and the mixed gas of the $GeH_4$ gas diluted with $H_2$ having a different flow ratio were supplied to form a 10 nm SiGe film 410 (steps S105 and S106). Next, the $SiH_4$ gas was supplied to form a 50 nm Si film 420 (step S107). Then, the number of defects on the substrate W disposed in the lowest slot of the wafer boat 5 and the substrate W disposed in the middle slot of the wafer boat 5 were counted. In FIG. 5, the vertical axis indicates the average value (Defect #) of the number of defects on the substrate W in the middle slot and the substrate W in the lowest slot. (a) to (i) indicate each running (process).

In (a) to (c), in steps S105 and S106, the $SiH_4$ gas was supplied from the gas supply source 23*a*1 (1,250 sccm), the mixed gas of the $GeH_4$ gas diluted to 10% with $H_2$ was supplied from the gas supply source 23*a*2 (630 sccm), and the $H_2$ gas was supplied from the gas supply source 23*a*3 (999 sccm). In step S107, the $SiH_4$ gas was supplied from the gas supply source 23*a*1 (1, 250 sccm) and the $H_2$ gas was supplied from the gas supply source 23*a*3 (999 sccm).

In (d) to (e), in steps S105 and S106, the $SiH_4$ gas was supplied from the gas supply source 23*a*1 (250 sccm), the mixed gas of the $GeH_4$ gas diluted to 1% with $H_2$ was supplied from the gas supply source 23*a*2 (1,260 sccm in (d) and 1,640 sccm in (e)), and the $H_2$ gas was supplied from the gas supply source 23*a*3 (999 sccm). In step S107, the $SiH_4$ gas was supplied from the gas supply source 23*a*1, and the $H_2$ gas was supplied from the gas supply source 23*a*3 (999 sccm).

In steps (f) to (i), in steps S105 and S106, the $SiH_4$ gas was supplied from the gas supply source 23*a*1 (100 sccm to 1,000 sccm), the mixed gas of the $GeH_4$ gas diluted to 10% with $H_2$ was supplied from the gas supply source 23*a*2 (10 sccm to 1,000 sccm), and the supply of the $H_2$ gas from the gas supply source 23*a*3 was stopped (0 sccm). In step S107, the $SiH_4$ gas was supplied from the gas supply source 23*a*1 (100 sccm to 1,000 sccm), and the supply of the $H_2$ gas from the gas supply source 23*a*3 was stopped (0 sccm).

In FIG. 5, the average number of the defects in (a) to (c) and the average number of the defects in (f) to (i) are indicated by dashed lines.

As indicated by comparing (a) to (c) and (f) to (i), the number of defects in (f) to (i) using the mixed gas of the $GeH_4$ gas diluted to 1% was reduced compared to that in (a) to (c).

As indicated by comparing (a) to (c) and (d) to (e), the number of defects in (f) to (i) using the mixed gas of the $GeH_4$ gas diluted to less than 1% was also reduced compared to that in (a) to (c).

Although the film formation method of the present embodiment by the substrate processing apparatus 100 has been described above, the present disclosure is not limited to the above embodiments, and various modifications and improvements can be made within the scope of the disclosure described in the claims.

According to one aspect, a substrate processing method and a substrate processing apparatus for forming a silicon germanium film can be provided.

What is claimed is:

1. A substrate processing method, comprising:

preparing a substrate in which a silicon oxide film is formed on a surface of a silicon substrate;

supplying a fluorine containing gas and a basic gas to the substrate having the silicon oxide film to remove the silicon oxide film;

supplying a hydrogen gas to the substrate in which the silicon oxide film is removed and applying a thermal treatment to the substrate;

supplying a mixed gas of a germanium containing gas diluted with a hydrogen gas to the substrate to which the thermal treatment is applied to perform pre-cleaning of the substrate; and forming a silicon germanium film by epitaxial growth on the substrate to which the pre-cleaning is performed.

2. The substrate processing method according to claim 1, wherein in the mixed gas, a flow ratio of the germanium containing gas to the mixed gas is 1% or less.

3. The substrate processing method according to claim 1, wherein the thermal treatment is applied at 800° C. or less.

4. The substrate processing method according to claim 1, wherein the germanium containing gas contains at least one of $GeH_4$, $GeH_2$, or $Ge_2H_6$.

5. The substrate processing method according to claim 1, wherein the preparing of the substrate includes wet cleaning of the substrate.

6. The substrate processing method according to claim 1, wherein the fluorine containing gas is HF, and the basic gas is at least one of $NH_3$ or an amine.

7. The substrate processing method according to claim 1, further comprising:

forming a silicon film by epitaxial growth on the substrate on which the silicon germanium film is formed.

* * * * *